United States Patent
Tadano et al.

(10) Patent No.: US 11,608,433 B2
(45) Date of Patent: Mar. 21, 2023

(54) FORMULATION AND PROCESSING SOLUTION FOR DICING PROCESS, AND METHOD FOR PROCESSING

(71) Applicant: NIKKA SEIKO CO., LTD., Tokyo (JP)

(72) Inventors: Tsuyoshi Tadano, Tokyo (JP); Masafumi Hirose, Tokyo (JP); Yuta Akutsu, Tokyo (JP)

(73) Assignee: NIKKA SEIKO CO., LTD. (JP)

( * ) Notice: Subject to any disclaimer, the term of this patent is extended or adjusted under 35 U.S.C. 154(b) by 724 days.

(21) Appl. No.: 16/542,768

(22) Filed: Aug. 16, 2019

(65) Prior Publication Data

US 2020/0075413 A1     Mar. 5, 2020

(30) Foreign Application Priority Data

Aug. 31, 2018 (JP) .............................. JP2018-163424

(51) Int. Cl.
*C08L 29/04* (2006.01)
*H01L 21/78* (2006.01)
*H01L 21/683* (2006.01)

(52) U.S. Cl.
CPC ........... *C08L 29/04* (2013.01); *C08L 2201/54* (2013.01); *H01L 21/6836* (2013.01); *H01L 21/78* (2013.01)

(58) Field of Classification Search
CPC ... C08L 29/04; C08L 2201/54; C09D 129/04; C09K 3/1463

USPC .......................................... 252/79.1; 438/690
See application file for complete search history.

(56) References Cited

U.S. PATENT DOCUMENTS

| | | | |
|---|---|---|---|
| 2004/0127047 A1* | 7/2004 | Yamada | H01L 21/30625 438/690 |
| 2016/0272846 A1* | 9/2016 | Tsuchiya | C09G 1/00 |
| 2019/0083490 A1* | 3/2019 | Saito | A61K 47/26 |

FOREIGN PATENT DOCUMENTS

| | | | | |
|---|---|---|---|---|
| JP | 2007027531 A | * | 2/2007 | |
| JP | 5253765 | | 7/2013 | |
| TW | 201105784 A | * | 2/2011 | ............... C09G 1/02 |

* cited by examiner

*Primary Examiner* — Lee E Sanderson
(74) *Attorney, Agent, or Firm* — Adams & Wilks

(57) ABSTRACT

A formulation for a wafer dicing process comprises 1.0 to 1.5 mass % of a partially saponified polyvinyl alcohol having a polymerization degree of 200 to 400 and a saponification degree of 75 to 85 mol %; 0.4 to 0.6 mass % of polyoxyethylene-polyoxypropylene glycol ether having a number average molecular weight of 10,000 to 20,000 with a polymerization ratio of polyoxyethylene to polyoxypropylene of 75:25 to 85:15; and pure water (all mass % based on 100 mass % of formulation). The formulation is used in the form of a processing solution obtained by diluting it 10,000 to 100,000 times by pure water and flowing it on a dicing blade in a wafer dicing process to effectively remove dicing offcuts from the wafer and minute pieces of adhesive released from an adhesive layer of a dicing tape.

14 Claims, 1 Drawing Sheet

FORMULATION AND PROCESSING SOLUTION FOR DICING PROCESS, AND METHOD FOR PROCESSING

FIELD OF THE INVENTION

The present invention relates to a processing formulation (composition) and a processing solution that are used in used a dicing process by which many chip-shaped devices formed on a wafer are separated by a dicing blade. The present invention also relates to a wafer processing method using the formulation and processing solution.

BACKGROUND INFORMATION

On wafers provided with patterns such as LSI, CMOS or power devices formed on a substrate made of a compound such as silicon or sapphire, many devices are formed and partitioned by division lines, often referred to as scribe streets or simply streets. When the devices separated lengthwise and widthwise by streets are singularized into individual pieces by dividing the wafer at the streets, dicing is typically carried out by a blade rotating at high speed or by irradiation with a laser beam.

When the dicing is carried out by a blade, the dicing is carried out smoothly by allowing a processing solution to flow in the region between the wafer and a rotating dicing blade to cool the part to be cut, and at the same time, to reduce frictional resistance at the time of cutting. During the dicing process, it is necessary to wash away and remove offcuts generated by dicing to prevent contamination of the separated devices.

To deal with the above problems, pure water was initially used as the processing solution, and various methods have been studied to improve upon the removal of splintered dicing offcuts. For example, there has been known a processing solution comprising a polymer which contains at least 50 mass % of vinyl pyrrolidone and is a polymer with an ethylene group-containing monomer such as vinyl acetate, having a weight average molecular weight of 40,000 to 160,000; and a blowing agent (JP-B-5253765).

By using such a processing solution as described in JP-B-5253765, it becomes possible to more efficiently remove splintered dicing offcuts of the wafer as compared with the cases using pure water. However, it was found that other matter still adheres to and remains on the devices, namely unremoved matter still exists.

The cause of such matter was unknown at an early stage. As a result of various researches, the following has been found. In the dicing operation of wafers, the wafers are adhered to an adhesive resin sheet (dicing tape) and the dicing tape is fixed to a wafer frame, and then the dicing process is carried out. In the dicing process, a dicing blade runs along the streets of the wafers to cut them into individual devices. The edge of the dicing blade slightly cuts into an adhesive layer of the dicing tape to complete the cutting of the wafer. At this moment, the edge of the dicing blade cuts and raises the adhesive of the adhesive layer and scatters it as minute pieces, and resultantly the minute pieces adhere as particle contaminants to the device surfaces.

Particularly, for image sensors to be used for cameras, attachment of even a small amount of dicing offcuts and minute pieces of adhesive to the lenses on the surface of the device chips causes deterioration of performance of the devices and increases the number of defective devices. Further improvements to deal with such attachment have been demanded.

SUMMARY OF THE INVENTION

As mentioned above, there has been a demand for a formulation for a dicing process and a processing solution made from the formulation, by which it becomes possible to efficiently remove not only the dicing offcuts formed from the wafers in the dicing step but also minute pieces of adhesive released from the adhesive layer of the dicing tape, which is considered to have a more adverse effect than the dicing dust.

Further, the dicing process is carried out while a large amount of pure water is poured and flowed constantly, and this step requires a very large amount of pure water and is costly, and sometimes brings about a shortage of water for domestic use of local residents.

The present invention provides a formulation for a dicing process, which comprises 1.0 to 1.5 mass % in relation to 100 mass % of formulation of a partially saponified polyvinyl alcohol having a polymerization degree of 200 to 400 and a saponification degree of 75 to 85 mol %; 0.4 to 0.6 mass % in relation to 100 mass % of formulation of polyoxyethylene-polyoxypropylene glycol ether having a number average molecular weight of 10,000 to 20,000 with a polymerization ratio of polyoxyethylene to polyoxypropylene of 75:25 to 85:15; and pure water. The term "pure water" as used herein means purified water, i.e., water that has been filtered or processed to remove impurities.

The formulation for a dicing process may further contain about 0.1 mass % in relation to 100 mass % of formulation of phenyl glycol.

The formulation for a dicing process is usually diluted 10,000 to 100,000 times with pure water to form a processing solution, and in a dicing process step, the processing solution is applied by flowing or ejecting it on parts at which dicing is carried out with the dicing blade.

According to the present invention, when a wafer for semiconductors, etc. is subjected to the dicing process, the minute pieces of adhesive released from the adhesive layer of the dicing tape by the dicing blade can be washed away together with the dicing offcuts by the processing solution. It is therefore possible to obtain a clear wafer surface, reduce defective products of chips on the wafer and increase the yield.

Further, in the present invention, the formulation for a dicing process is effective even if it is diluted to a high degree to form a processing solution so that it is possible to flow the processing solution used for the dicing process to regeneration facilities of used water without extra load and labor. As a result, the used water can be reused for other steps, etc. and wastewater treatment can be efficiently made.

BRIEF DESCRIPTION OF THE DRAWINGS

The foregoing summary, as well as the following detailed description of the preferred embodiments of the invention, will be better understood when these are read in conjunction with the accompanying drawings. The following description including the drawings show preferred embodiments of the present invention. It should be understood, however, that the present invention is not limited to these embodiments.

DETAILED DESCRIPTION OF THE PREFERRED EMBODIMENTS

Figure 1A:
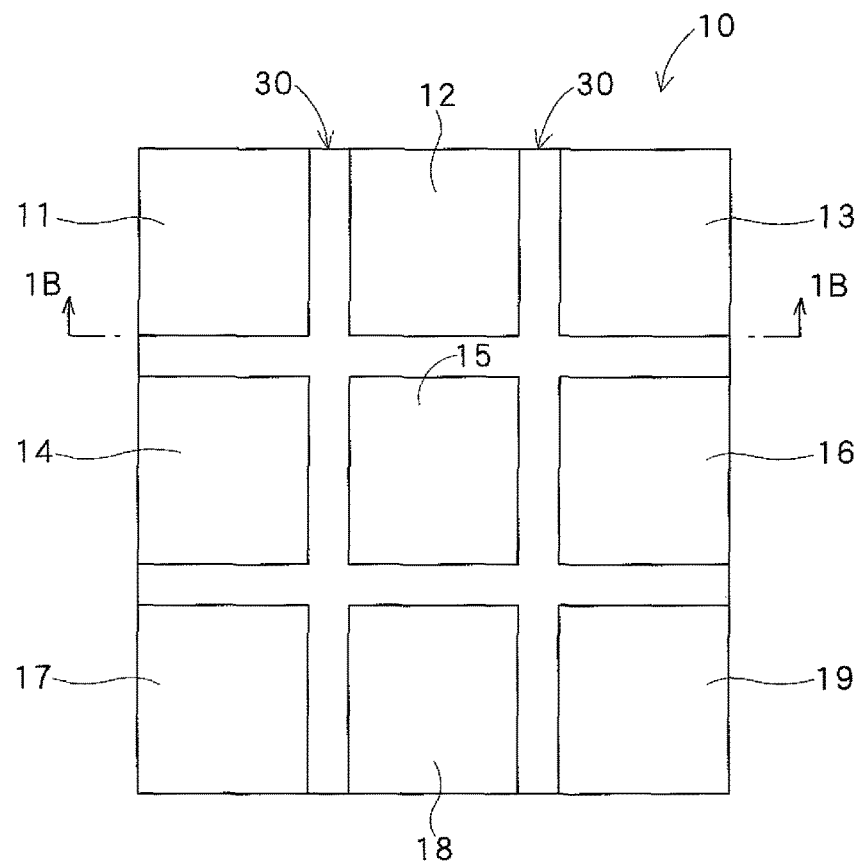
FIG. 1A is a plan view schematically showing a part of a wafer having many circuit structures formed on the wafer surface and partitioned by streets.
Figure 1B:
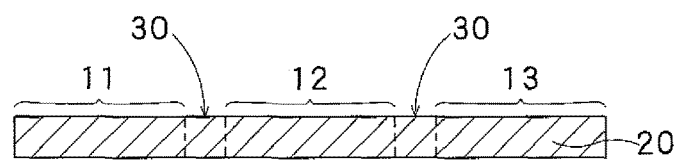
FIG. 1B is a cross-sectional side view along the line 1B-1B of FIG. 1A.

FIG. 1A is a plan view schematically showing a substrate like a wafer having many circuit structures formed on its surface. FIG. 1B is a cross-sectional side view along the line 1B-1B of FIG. 1A.

In FIGS. 1A and 1B, a structure 10 includes a substrate 20 of, for example, a semiconductor substance such as silicon, or a semiconductor layer on an insulating material such as glass.

Structure 10 is a part of the structure of a wafer having many circuit structures (dies or chips) 11, 12, 13, 14, 15, 16, 17, 18 and 19 formed on the wafer surface. Respective circuit structures are partitioned on the wafer by streets (division lines) 30 which are used to partition the circuit structures from the substrate 20 into a discrete die or chip.

Figure 2:
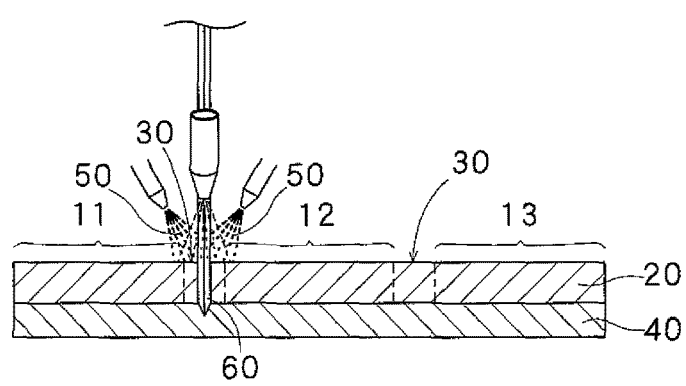
FIG. 2 is an explanatory cross-sectional side view showing the wafer illustrated in FIG. 1B adhered to a dicing tape during a dicing process using a dicing blade while supplying a processing solution of the present invention.

FIG. 2 is an explanatory view showing a condition in which the structure 10 illustrated in FIG. 1B is fixed by adhesive to a dicing tape 40, and the dicing process is carried out by using a dicing blade 60 cutting along a street 30 while supplying a processing solution 50 of the present invention. In the drawing, an edge of the dicing blade 60 slightly cuts into the dicing tape 40. In this embodiment, the processing solution 50 is supplied through nozzles (not numbered) to the region where the rotating dicing blade 50 contacts the streets 30.

As a component of the formulation for a dicing process of the present invention, polyvinyl alcohol is used. The polyvinyl alcohol is one having a polymerization degree of vinyl alcohol ranging about 200 to 400, preferably about 250 to 350, and more preferably about 280 to 320.

Further, the polyvinyl alcohol is a partially saponified polyvinyl alcohol, and its saponification degree is about 70 to 90 mol %, preferably about 75 to 85 mol %, and more preferably about 78 to 82 mold.

Together with the partially saponified polyvinyl alcohol, polyoxyethylene-polyoxypropylene glycol ether is used. The polyoxyethylene-polyoxypropylene glycol ether is a copolymer of polyoxyethylene and polyoxypropylene glycol, and the polymerization ratio thereof is about 75:25 to 85:15, preferably about 80:20 to 83:17. Its number average molecular weight is about 10,000 to 20,000, preferably about 13,000 to 18,000, and more preferably about 14,000 to 16,000.

When 1.0 to 1.5 mass % in relation to 100 mass % of formulation of a partially saponified polyvinyl alcohol and 0.4 to 0.6 mass % in relation to 100 mass % of formulation of polyoxyethylene-polyoxypropylene glycol ether are dissolved in pure water, a formulation for a dicing process is obtained.

To use the formulation in a dicing process, the formulation is highly diluted 10,000 to 100,000 times with pure water to form a processing solution. The diluted processing solution is continuously supplied to the part where the dicing of a wafer is carried out by use of a dicing blade, and the dicing offcuts formed by the dicing and the minute pieces of adhesive released from the dicing tape are removed by washing them away. Further, at the same time, a local temperature increase of the wafer by the friction of the dicing blade can be reduced or even prevented.

For the formulation for a dicing process, about 0.1 mass % in relation to 100 mass % of formulation of phenyl glycol may further be used as a preservative.

Further, a pH adjuster or any other chemical agents may appropriately be used as the case requires.

EXAMPLES

Example 1

As a partially saponified polyvinyl alcohol, one having a polymerization degree of vinyl alcohol of 300, a saponification degree of 80 mol % and a number average molecular weight of 16,000 was used.

As polyoxyethylene-polyoxypropylene glycol ether, a polymer of polyoxyethylene glycol and polyoxypropylene glycol, with their polymerization ratio of 83:17 and a number average molecular weight of 16,000 was used.

As shown in Table 1, 1.33 mass % in relation to 100 mass % of formulation of the partially saponified polyvinyl alcohol (indicated by Polymer A) and 0.5 mass % in relation to 100 mass % of formulation of polyoxyethylene-polyoxypropylene glycol ether (indicated by Surfactant A) were mixed with and dissolved in 98.17 mass % in relation to 100 mass % of formulation of pure water (balance), to obtain a formulation for a dicing process.

Comparative Example 1

0.83 mass % in relation to 100 mass % of formulation of a copolymer having a molar ratio of polyvinyl pyrrolidone to vinyl acetate of 6:4 and a weight average molecular weight of 51,000 (indicated by Polymer B) and 0.83 mass % in relation to 100 mass % of formulation of polyoxyethylene-polyoxypropylene glycol ether (indicated by Surfactant A) were mixed with and dissolved in 98.34 mass % in relation to 100 mass % of formulation of pure water (balance), to obtain a formulation for dicing process (Table 1).

Comparative Example 2

1.33 mass % in relation to 100 mass % of formulation of pullulan (a polysaccharide of maltotriose bonded by α-1,6 bond) (indicated by Polymer C) and 0.33 mass % in relation to 100 mass % of formulation of a polyoxyalkylene alkyl ether (HLB 14.7) (indicated by Surfactant B) were mixed with and dissolved in 98.34 mass % in relation to 100 mass % of formulation of pure water (balance), to obtain a formulation for dicing process (Table 1).

Test

The following tests were conducted to measure properties and performance of the Example and Comparative Examples.

Test 1

Dicing Process Tests for Respective Components:

Each of the formulations for a dicing process in Example 1 and Comparative Examples 1 and 2 was diluted 10,000 times with pure water to prepare a processing solution for a dicing process. A silicon wafer with a diameter of 300 mm on which a low-k film was formed as a mock-image sensor was set on a dicing machine AD3000T-HC manufactured by Tokyo Seimitsu Co., Ltd., and then a dicing process was carried out while supplying the processing solution at a flow rate of 15 liters/min. on a part to be cut.

After completion of dicing, the wafer was inspected by a wafer inspection machine "Eagle" manufactured by Camtek Ltd. and a measuring microscope manufactured by Olympus Corporation to evaluate the quality of cutting by the dicing process and the dust amount on the wafer surface.

The quality of cutting was evaluated by comparing the occurrence of burning (scorch, singe), breakage and chipping of cut chips.

Further, the dust amount on the wafer surface was determined by calculating the number of dust particles existing on the surface of the chip and then indicating it by such an index that the dust amount of Comparative Example 2 represents 1.00. As the index is smaller, the dust amount is smaller, and the wafer surface is less contaminated.

Results and Evaluation of the Dicing Process Tests for Respective Components:

The results of the dicing process tests for respective components are indicated in Table 1.

As a measure of the quality of cutting, the occurrence of burning, breakage and chipping were evaluated. In each of Example and Comparative Examples 1 and 2, occurrence thereof was not observed, i.e., the results are excellent (O) and no significant difference was seen among them.

As the dust amount (index) on the wafer surface, Comparative Example 2 is 1.00 and Comparative Example 1 is 0.25. On the other hand, Example 1 shows further decreased dust amount of 0.20, and it is therefore found that the dust amount on the wafer surface is low and the degree of contamination is decreased to a great extent.

Test 2

Dicing process tests for respective dilution ratios: Dicing process tests were carried out on Example 1 and Comparative Example 1 in the same manner as above except that the dilution ratio of the formulation was changed.

As the degree of dilution of the formulation, in addition to the 10,000 times diluted solution as mentioned above, a 60,000 times diluted solution and a 100,000 times diluted solution were prepared for the tests.

Results and Evaluation of the Dicing Process Tests for Respective Dilution Ratios:

The results of the dicing process tests for respective dilution ratios are indicated in Table 2.

As compared with the 10,000 times diluted solution of Example 1, the 60,000 times diluted solution of Example 1-2 shows the dust amount (index) of 0.14 decreased as compared with 0.20 of Example 1, and the 100,000 times diluted solution of Example 1-3 also shows a decreased index of 0.18 as compared with 0.20 of Example 1.

On the other hand, as compared with the 10,000 times diluted solution of Comparative Example 1 showing the dust amount (index) of 0.25, the 60,000 times diluted solution of Comparative Example 1-2 is increased to 0.45, and the 100,000 times diluted solution of Comparative Example 1-3 is further increased to 0.69.

As mentioned above, Comparative Example 1 shows that the dust amount is increased when the dilution ratio is raised. On the contrary, Example 1 shows that even when the dilution ratio is raised, the dust amount is substantially unchanged, rather it is decreased, and therefore it can be sufficiently used at a high dilution ratio.

TABLE 1

| | Ex. 1 | Comp. Ex. 1 | Comp. Ex. 2 |
|---|---|---|---|
| Composition | | | |
| Polymer A | 1.33 | | |
| Polymer B | | 0.83 | |
| Polymer C | | | 1.33 |
| Surfactant A | 0.50 | 0.83 | |
| Surfactant B | | | 0.33 |
| Pure water | 98.17 | 98.34 | 98.34 |
| Total | 100 | 100 | 100 |
| Degree of dilution (times) | 10,000 | 10,000 | 10,000 |
| Results of evaluation | | | |
| Quality of cutting (*1) | O | O | O |
| Dust amount (index) | 0.20 | 0.25 | 1.00 |

(*1): burning, breakage and chipping

TABLE 2

| | Ex. 1 | Ex. 1-2 | Ex. 1-3 | Comp. Ex. 1 | Comp. Ex. 1-2 | Comp. Ex. 1-3 |
|---|---|---|---|---|---|---|
| Composition | | | | | | |
| Polymer A | 1.33 | | | | | |
| Polymer B | | | | 0.83 | | |
| Surfactant A | 0.50 | | | 0.83 | | |
| Pure water | 98.17 | | | 98.34 | | |
| Total | 100 | | | 100 | | |
| Degree of dilution | 10,000 times | 60,000 times | 100,000 times | 10,000 times | 60,000 times | 100,000 times |
| Results of evaluation | | | | | | |
| Dust amount (index) | 0.20 | 0.14 | 0.18 | 0.25 | 0.45 | 0.69 |

The present invention is not limited to the details of the above described embodiments. The scope of the invention is defined by the appended claims and all changes and modifications that fall within the scope of the claims are therefore to be embraced by the invention.

We claim:

1. A wafer dicing process comprising:
providing a wafer fixed by adhesive onto a dicing tape, the wafer having circuit structures formed on the wafer surface, and the circuit structures being separated from one another by streets;
dicing the wafer along the streets using a rotating dicing blade to divide the wafer into individual circuit structures; and
continuously flowing a processing solution to the region where the dicing blade contacts the wafer to remove dicing offcuts and adhesive particles released from the dicing tape during dicing,
wherein the processing solution comprises a formulation diluted 10,000 to 100,000 times by pure water, and
wherein the formation comprises 1,0 to 1.5 mass % in relation to 100 mass % of formulation of a partially saponified polyvinyl alcohol having a polymerization degree of 200 to 400 and a saponification degree of 75 to 85 mol %; 0,4 to 0.6 mass % in relation to 100 mass % of formulation of polyoxyethylene-polyoxypropylene glycol ether having a number average molecular weight of 10,000 to 20,000 with a polymerization ratio of polyoxyethylene to polyoxypropylene of 75:25 to 85:15; and pure water.

2. The wafer dicing process according to claim 1, wherein the partially saponified polyvinyl alcohol of the formulation for dicing process has a polymerization degree of 300 and a saponification degree of 80 mol %.

3. The wafer dicing process according to claim 1, wherein the partially saponified polyvinyl alcohol of the formulation has a polymerization degree of 300 and a saponification degree of 80 mol %; and the polyoxyethylene-polyoxypropylene glycol ether of the formulation has a number average molecular weight of 15,500 with a polymerization ratio of polyoxyethylene to polyoxypropylene of 83:17.

4. The wafer dicing process according to claim 1, wherein the formulation further comprises 0.1 mass % in relation to 100 mass % of formulation of phenyl glycol.

5. A processing solution used during a wafer dicing process to reduce the amount of particulate contaminants remaining on the wafer surface after completion of the wafer dicing process, the processing solution comprising:
 a formulation diluted 10,000 to 100,000 times by pure water, wherein the formulation comprises:
 1,0 to 1.5 mass % of a partially saponified polyvinyl alcohol having a polymerization degree of 200 to 400 and a saponification degree of 75 to 85 mol %, and
 0.4 to 0.6 mass % of polyoxyethylene-polyoxypropylene glycol ether having a number average molecular weight of 10,000 to 20,000 with a polymerization ratio of polyoxyethylene to polyoxypropylene of 75:25 to 85:15.

6. The processing solution according to claim 5; wherein the processing solution further comprises 0.1 mass % of phenyl glycol.

7. The processing solution according to claim 5; wherein the saponified polyvinyl alcohol has a polymerization degree of 300 and a saponification degree of 80 mol %.

8. The processing solution according to claim 7; wherein the processing solution further comprises 0.1 mass % of phenyl glycol.

9. The processing solution according to claim 5; wherein the polyoxyethylene-polyoxypropylene glycol ether has a number average molecular weight of 15,500 with a polymerization ratio of polyoxyethylene to polyoxypropylene of 83:17.

10. The processing solution according to claim 9; wherein the processing solution further comprises 01 mass % of phenyl glycol.

11. The processing solution according to claim 5; wherein the formulation comprises:
 1.0 to 1.5 mass % of a partially saponified polyvinyl alcohol having a polymerization degree of 300 and a saponification degree of 80 mol %, and
 0.4 to 0.6 mass % of polyoxyethylene-polyoxypropylene glycol ether having a number average molecular weight of 15,500 with a polymerization ratio of polyoxyethylene to polyoxypropylene of 83:17.

12. The processing solution according to claim 11; wherein the processing solution further comprises 0.1 mass % of phenyl glycol.

13. The processing solution according to claim 5; wherein the processing solution does not contain an abrasive.

14. The processing solution according to claim 13; wherein the processing solution further comprises 0.1 mass % of phenyl glycol.

* * * * *